United States Patent
Roycroft et al.

(10) Patent No.: US 7,399,684 B2
(45) Date of Patent: Jul. 15, 2008

(54) DEFECT REDUCTION IN SEMICONDUCTOR MATERIALS

(75) Inventors: Brendan John Roycroft, County Cork (IE); Pleun Pieter Maaskant, Cork (IE)

(73) Assignee: University College Cork - National University of Ireland, Cork, Cork (IE)

( * ) Notice: Subject to any disclaimer, the term of this patent is extended or adjusted under 35 U.S.C. 154(b) by 340 days.

(21) Appl. No.: 11/030,986

(22) Filed: Jan. 10, 2005

(65) Prior Publication Data
US 2005/0124143 A1 Jun. 9, 2005

Related U.S. Application Data

(63) Continuation of application No. PCT/EP03/007604, filed on Jul. 11, 2003.

(30) Foreign Application Priority Data
Jul. 11, 2002 (IE) .................. 2002/0574

(51) Int. Cl.
*H01L 21/20* (2006.01)
(52) U.S. Cl. ................. 438/478; 438/481
(58) Field of Classification Search ........... 438/481, 438/41, 478, 46, 44
See application file for complete search history.

(56) References Cited

U.S. PATENT DOCUMENTS

| | | | | |
|---|---|---|---|---|
| 4,404,265 | A | 9/1983 | Manasevit | 428/689 |
| 6,121,121 | A | 9/2000 | Koide | 438/481 |
| 6,380,051 | B1 * | 4/2002 | Yuasa et al. | 438/481 |
| 6,623,560 | B2 * | 9/2003 | Biwa et al. | 117/95 |
| 6,653,166 | B2 * | 11/2003 | Ledentsov | 438/77 |
| 6,979,584 | B2 * | 12/2005 | Koike et al. | 438/44 |
| 7,101,444 | B2 * | 9/2006 | Shchukin et al. | 148/33 |
| 2001/0008299 | A1 | 7/2001 | Linthicum et al. | 257/613 |
| 2002/0005593 | A1 | 1/2002 | Bourret-ourchesne | 257/790 |
| 2002/0022290 | A1 | 2/2002 | Kong et al. | |

FOREIGN PATENT DOCUMENTS
EP 1111663 A3 6/2001

OTHER PUBLICATIONS

Weyher et al, Materials Science & Engineering B80, pp. 318-321, 2001, Study of individual grown-in and indentation-induced.

* cited by examiner

*Primary Examiner*—Tuan H Nguyen
(74) *Attorney, Agent, or Firm*—Jacobson Holman PLLC

(57) ABSTRACT

An initial epitaxial layer of GaN is grown on a sapphire substrate. The epitaxial layer is then etched in a reactive ion etch (RIE) chamber. This etching acts preferentially at defects, causing them to become enlarged cavities. The cavities are too large in proportion to the crystal lattice to act as defects in the usual sense, and so a further GaN epitaxial layer fills into the cavities. Thus, propagation of defects is avoided.

14 Claims, 1 Drawing Sheet

Figure 1:
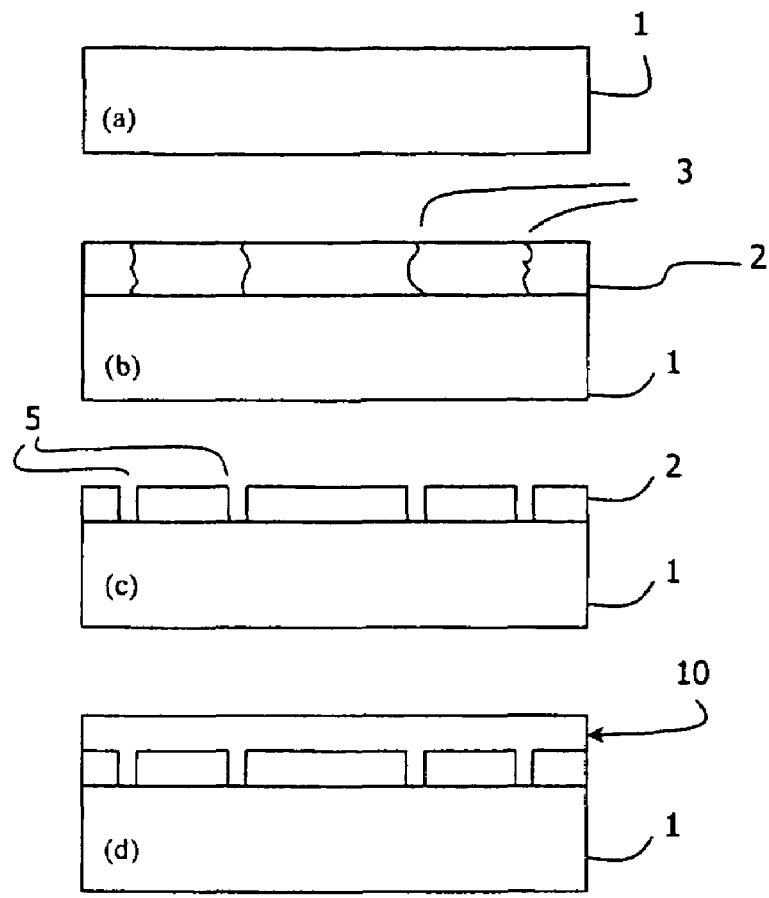

ID_REDUCTION IN SEMICONDUCTOR
DEFECT REDUCTION IN SEMICONDUCTOR MATERIALS

This is a continuation of PCT/EP03/007604 filed Jul. 11, 2003 and published in English.

The invention relates to the production of epitaxial materials with a reduced defect density.

Epitaxial wafer materials are widely used as starting materials in semiconductor device fabrication. The presence of defects in such wafer materials can seriously affect the subsequent device performance. For example, GaN and its related compounds InGaN and AlGaN are widely used in the fabrication of short-wavelength semiconductor laser diodes. The performance of such laser diodes is seriously degraded by the presence of threading dislocations, which thread vertically through the epitaxial layers. Similar defects are found in other material systems, for example, when GaAs is grown on SiGe/Si. A reduced dislocation density on the epitaxial wafer materials is therefore desired. It shall be understood in the following descriptions that GaN shall also refer to its compounds (In)(Al)(Ga)N, and may be p-type, n-type or undoped.

A prior approach known to the inventors to solve the problem of reducing the defect density is Epitaxial Layer Overgrowth (ELOG) described in US patent application US2002/0022290. In this approach, narrow strips of silicon dioxide are patterned on a GaN buffer layer. GaN growth is then restarted until the $SiO_2$ strips are covered and a planar surface is achieved. The defects under the strips are blanked out and epitaxial material above the strips apparently has a lower defect density than the material grown between the strips. The material above the $SiO_2$ is found to be of high quality, but the material between the strips is unchanged, and so it appears that multiple steps of ELOG need to be made to create large areas of good quality material. Defect density in good ELOG growth is reduced from $10^{10}$ cm$^{-2}$ in standard GaN/Sapphire growth, to $10^8$ cm$^{-2}$ in 1 step ELOG, or to $5.10^5$ cm$^{-2}$ after multiple steps of ELOG. A defect density of $5.10^5$ cm$^{-2}$ corresponds to 1 defect per 14 µm×14 µm square area. Therefore, the size of a defect-free area is still small in comparison to the 50 mm diameter wafer area available for device fabrication.

Another problem is that this approach requires considerable additional effort in processing and regrowth, requiring over 100 µm of epitaxial growth for best results.

A second approach, described in US patent application US2002/0005593 is to grow standard GaN epitaxial layers at high temperature (1000° C.), then deposit a thin layer of GaN at a lower temperature (700-900° C.), then resume growth at the high temperature (1000° C.). It is claimed that this prevents defects from propagating vertically, and reduces the defect density from >$10^{10}$ cm$^{-2}$ to $4.10^7$ cm$^{-2}$. This approach suffers from insufficient removal of defects.

A third approach is the direct production of GaN substrates from liquid gallium, and nitrogen at very high pressure (45,000 bar) (by Unipress in Poland). This approach suffers from the use of very highly specialised and expensive equipment, and the production of rather small (~1 cm$^2$) GaN crystals.

The invention is therefore directed towards providing a method and system to produce large areas of epitaxial material with low defect density in a simple and effective manner, using relatively common and inexpensive equipment and materials.

STATEMENTS OF INVENTION

According to the invention, there is provided a method of producing a low-defect semiconductor wafer in which an epitaxial layer is grown on a substrate, the method comprising the steps of:
  (a) growing a layer of epitaxial material on the substrate,
  (b) etching the epitaxial layer in such a manner as to preferentially etch the defects of the layer; and
  (c) growing a subsequent layer of epitaxial material on the etched epitaxial layer.

In one embodiment, the step (b) is performed by exposing the surface to dry etching by RIE, or ICP (Inductively Coupled Plasma etching), or chemically assisted ion beam etching, or other suitable dry etching process.

In another embodiment, the step (b) is performed by immersion in aqua regia, or a mixture of KOH/NaOH, or other suitable wet etching solution.

In a further embodiment, an additional compound is added for the growth step (c) to improve surface smoothness.

In one embodiment, the additional compound is In(Ga)N, or Al(Ga)N, or magnesium doped (Al)(In)(Ga)N.

In another embodiment, the epitaxial material is GaN.

In a further embodiment, the substrate is of sapphire material.

In one embodiment, the substrate is of Si, SiC, or diamond material.

In one embodiment, the epitaxial material is InP.

In another embodiment, the epitaxial material is GaAs.

In a further embodiment, the method comprises the further steps of repeating steps (b) and (c) one or more additional times until a target defect density is achieved.

In one embodiment, the etching is performed in-situ within a growth chamber.

In another embodiment, the etching is performed under vacuum.

According to another aspect, the invention provides a semiconductor wafer whenever produced by a method as defined above.

DETAILED DESCRIPTION OF THE INVENTION

Figure 2:
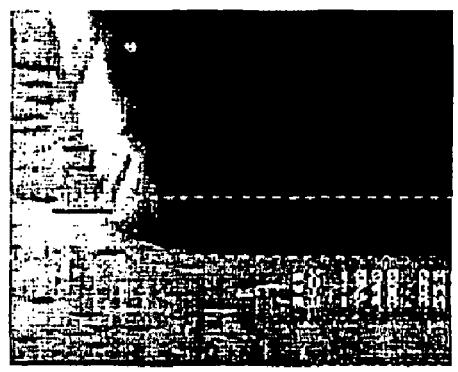

The invention will be more clearly understood from the following description of some embodiments thereof, given by way of example only with reference to the accompanying drawings in which:

FIGS. 1(a) to 1(d) are a series of diagrams showing a semiconductor growth method of the invention; and FIG. 2 is a photograph illustrating the surface of etched GaN after RIE.

Referring to FIG. 1(a), a sapphire substrate 1 acts as the substrate for the epitaxial growth of device quality wafer material. As shown in FIG. 1(b) an initial epitaxial layer 2 of GaN is grown on the substrate 1 in a conventional manner. However, there are many defects 3 which thread through the epitaxial layer 2.

Referring to FIG. 1(c) the epitaxial layer 2 is etched by wet or dry etching within the growth chamber. The etching acts preferentially on the epitaxial layer 2 at the defects 3, causing them to become enlarged cavities 5, which may or may not extend down to the substrate 1. These cavities 5 appear as black dots in the photograph of an etched surface shown in FIG. 2. The cavities 5 are too large in proportion to the crystal lattice to act as defects in the usual sense. Thus, when a further layer of GaN is grown (FIG. 1(d)) it fills into the cavities 5 with lateral growth and over the layer 2 to form a homogeneous relatively-defect-free epitaxy 10. Indium or magnesium may be added to the GaN to aid planarisation. Steps (c) and (d) may be repeated if removal of defects was not sufficient in step (c). Further epitaxial growth allows wafer materials for devices such as high power transistors, light emitting diodes, and laser diodes to be produced.

The following are two detailed examples of implementation of the invention.

EXAMPLE 1

Starting with a substrate suitable for GaN growth (commonly sapphire, but may be SiC or other), GaN growth is initiated in the standard way by MOVPE or MBE. It has been found by other groups that after an initial three dimensional growth, a two dimensional growth mode takes over. Incorporated unintentionally in this two dimensional growth are many threading dislocations which propagate upwards through any subsequent growth. After the planar growth mode is established, the wafer is removed from the growth chamber and placed in a reactive ion etch (RIE) chamber. Etching proceeds with a mixture of $SiCl_4/H_2$ as the etchant. This has been found to preferentially etch macroscopic defects and threading dislocations. The time of etching is left to the discretion of the operator, but should be long enough to cause substantial etching of the defects, which may or may not be etched all the way back to the substrate. After dry etching, the surface is heat treated at 300-1000° C. in a $N_2$ or $NH_3$ ambient. GaN growth is then resumed in the growth reactor until a planar surface is achieved. The wafer is now ready for the subsequent growth of device epitaxial layers, as required.

EXAMPLE 2

Starting with a substrate suitable for GaN growth (commonly sapphire, but may be SiC or other), GaN growth is initiated in the standard way by MOVPE or MBE. After the planar growth mode is established, the wafer is removed from the growth chamber and placed in a beaker of boiling aqua regia solution ($HCl:HNO_3$ at 3:1). Etching has been found to leave the good quality GaN areas almost unaffected, but macroscopic defects and threading dislocations are substantially etched. The time of etching is left to the discretion of the operator, but should be long enough to cause substantial etching of the defects, which may or may not be etched all the way back to the substrate. The wafer is then removed from the solution, placed in boiling ammonia polysulfide solution for ten minutes, removed, rinsed in de-ionised water, then dried. Finally, GaN growth is resumed in the growth reactor until a planar surface is achieved. The wafer is now ready for subsequent device epitaxial layers, as required.

It will be appreciated that the invention achieves a more effective reduction of defects with simpler processing than the prior art. For example, because the etching step is applied to the whole wafer surface there is no need for definition/masking of surface areas as in the ELOG approach. Further, the invention does not require the incorporation of a foreign material (such as $SiO_2$ or $Si_xN_y$ in ELOG) as it effectively provides an homogenous GaN epitaxy over the substrate. A further advantage is that defects are removed over the whole surface, rather than in strips as in ELOG. It will also be appreciated that there is little material wastage as only about 1 micron is lost due to the dry etching, and almost no material is lost due to the wet etching. Regrowth may achieve planarisation in less than 1 micron of growth, due to the small size of the defects. In ELOG, at least 2 micron growth is required to cover the $SiO_2$ strips and to achieve a planarised surface, often over 100 micron growth is used.

It is envisaged that the invention can be applied to the growth of other epitaxial layers for a wide variety of semiconductor devices, such as InP, GaAs, and Si.

Further any other suitable substrate may be used such as Si, SiC, or diamond. Also, any suitable wet or dry etching method which preferentially etches the defects may be used.

The invention is not limited to the embodiments described but may be varied in construction and detail.

The invention claimed is:

1. A method of producing a low-defect semiconductor wafer in which an epitaxial layer is grown on a substrate, the method comprising the steps of:
   a) growing a layer of epitaxial material on the substrate, said epitaxial layer including defects;
   b) etching a whole surface of the epitaxial layer in such a manner as to preferentially etch the defects of the layer; and
   c) growing a subsequent layer of epitaxial material on the etched epitaxial layer and the substrate to provide a homogeneous epitaxy over the substrate.

2. The method as claimed in claim 1, wherein the step (b) is performed by exposing the surface to dry etching by RIE, or ICP (Inductively Coupled Plasma etching), or chemically assisted ion beam etching, or other suitable dry etching process.

3. The method as claimed in claim 1, wherein the step (b) is performed by immersion in aqua regia, or a mixture of KOH/NaOH, or other suitable wet etching solution.

4. The method as claimed in claim 1, wherein an additional compound is added for the growth step (c) to improve surface smoothness.

5. The method as claimed in claim 4, wherein the additional compound is In(Ga)N, or Al(Ga)N, or magnesium doped (Al)(In)(Ga)N.

6. The method as claimed in claim 1, wherein the epitaxial material is GaN.

7. The method as claimed in claim 6, wherein the substrate is of sapphire material.

8. The method as claimed in claim 1, wherein the substrate is of Si, SiC, or diamond material.

9. The method as claimed in claim 1, wherein the epitaxial material is InP.

10. The method as claimed in claim 1, wherein the epitaxial material is GaAs.

11. The method as claimed in claim 1, further comprising the steps of repeating steps (b) and (c) one or more additional times until a target defect density is achieved.

12. The method as claimed in claim 1, wherein the etching is performed in-situ within a growth chamber.

13. The method as claimed in claim 1, wherein the etching is performed under vacuum.

14. A semiconductor wafer whenever produced by a method as claimed in claim 1.

* * * * *